(12) United States Patent
Chang

(10) Patent No.: US 9,791,487 B2
(45) Date of Patent: Oct. 17, 2017

(54) METHOD AND DEVICE FOR MEASURING SIGNALS

(71) Applicant: EGALAX_EMPIA TECHNOLOGY INC., Taipei (TW)

(72) Inventor: Chin-Fu Chang, Taipei (TW)

(73) Assignee: EGALAX_EMPIA TECHNOLOGY INC., Taipei (TW)

( * ) Notice: Subject to any disclaimer, the term of this patent is extended or adjusted under 35 U.S.C. 154(b) by 959 days.

(21) Appl. No.: 13/851,497

(22) Filed: Mar. 27, 2013

(65) Prior Publication Data

US 2013/0257458 A1     Oct. 3, 2013

Related U.S. Application Data

(60) Provisional application No. 61/617,196, filed on Mar. 29, 2012.

(30) Foreign Application Priority Data

Dec. 28, 2012  (TW) .............................. 101150798 A

(51) Int. Cl.
*G01R 27/26* (2006.01)
*G06F 3/041* (2006.01)
*G06F 3/044* (2006.01)

(52) U.S. Cl.
CPC ......... *G01R 27/2605* (2013.01); *G06F 3/044* (2013.01); *G06F 3/0416* (2013.01); *G06F 3/0418* (2013.01)

(58) Field of Classification Search
CPC ..... G01R 27/26; G01R 27/2605; G06F 3/044; G06F 3/0416; G06F 3/041; G06F 3/033; G06F 3/0418; H01L 29/76816; G06G 7/184; G09G 5/00; G01N 27/02
USPC .......................... 324/658–690; 345/156–184; 178/18.01–18.06, 20.01–20.04, FOR. 1, 178/FOR. 103; 257/203, 235–236, 239; 438/144, 60, 73–77
See application file for complete search history.

(56) References Cited

U.S. PATENT DOCUMENTS

| | | | | | |
|---|---|---|---|---|---|
| 3,445,593 | A | * | 5/1969 | Perkett | ...................... H04L 5/02 327/3 |
| 3,539,925 | A | * | 11/1970 | Seidel | .................... G01R 25/00 329/346 |
| 4,048,525 | A | * | 9/1977 | Goldberg | ............... G11C 27/04 257/236 |
| 4,181,949 | A | * | 1/1980 | Hall | ........................ G01R 25/08 324/119 |
| 5,374,787 | A | * | 12/1994 | Miller | .................... G06F 1/1626 178/18.06 |
| 5,451,910 | A | * | 9/1995 | Guthrie | ..................... H03L 7/16 327/105 |

(Continued)

*Primary Examiner* — Patrick Assouad
*Assistant Examiner* — Khristopher Yodichkas
(74) *Attorney, Agent, or Firm* — WPAT, PC

(57) ABSTRACT

Sinusoidal drive is used, and a coefficient table for a plurality of predetermined phases is established, wherein each predetermined phase is designated with a coefficient. A sinusoidal wave is measured at the plurality of predetermined phases of each half cycle to produce measured signals, and each of the measured signals is multiplied with the coefficient corresponding to the phase at which the signal is measured to produce a weighted measured signal. Then, the weighted measured signals are summed to produce a complete measured signal.

18 Claims, 6 Drawing Sheets

(56) References Cited

U.S. PATENT DOCUMENTS

| | | | | | |
|---|---|---|---|---|---|
| 5,471,534 | A | * | 11/1995 | Utter | H04B 1/1646 348/E7.042 |
| 5,943,639 | A | * | 8/1999 | Tanaka | G01D 5/24404 324/207.12 |
| 6,424,133 | B1 | * | 7/2002 | Choi | G05F 1/56 323/282 |
| 6,483,287 | B2 | * | 11/2002 | Otsubo | G01R 13/345 324/76.39 |
| 6,973,150 | B1 | * | 12/2005 | Thuringer | H03L 7/095 375/371 |
| 8,102,376 | B2 | * | 1/2012 | Lii | G06F 3/038 345/173 |
| 2003/0047360 | A1 | * | 3/2003 | Katsurahira | G06F 3/046 178/19.03 |
| 2006/0066289 | A1 | * | 3/2006 | Tanbakuchi | G01R 27/28 324/76.19 |
| 2007/0247099 | A1 | * | 10/2007 | Lu | H02P 6/182 318/461 |
| 2008/0186019 | A1 | * | 8/2008 | Hinz | G01D 5/2451 324/207.21 |
| 2008/0197931 | A1 | * | 8/2008 | Ueno | H03K 3/0315 331/57 |
| 2009/0072957 | A1 | * | 3/2009 | Wu | B60Q 9/004 340/435 |
| 2011/0087455 | A1 | * | 4/2011 | Chang | G06F 3/0416 702/150 |
| 2011/0205385 | A1 | * | 8/2011 | Matsumoto | G10L 21/0208 348/222.1 |
| 2011/0216058 | A1 | * | 9/2011 | Oh | G09G 3/3614 345/213 |
| 2012/0056841 | A1 | | 3/2012 | Krenik et al. | |
| 2012/0139561 | A1 | * | 6/2012 | Iwamoto | G06F 3/044 324/663 |
| 2014/0049270 | A1 | * | 2/2014 | Chang | G06F 3/0416 324/658 |
| 2014/0114607 | A1 | * | 4/2014 | Chang | G06F 3/041 702/150 |

\* cited by examiner

METHOD AND DEVICE FOR MEASURING SIGNALS

CROSS REFERENCE TO RELATED PATENT APPLICATION

This patent application claims the domestic priority of the U.S. provisional application 61/617,196 filed on Mar. 29, 2012, and the benefit of Taiwan Application Serial No. 101150798, filed on Dec. 28, 2012, which is herein incorporated by reference for all intents and purposes.

BACKGROUND OF THE INVENTION

1. Field of the Invention

The present invention relates to a method and device for measuring signals, and more particularly, to a method and device for using signal orthogonality as the basis for measuring signals.

2. Description of the Prior Art

A conventional mutual capacitive sensor includes an insulating surface layer, a first conductive layer, a dielectric layer, a second conductive layer. The first conductive layer and the second conductive layer have a plurality of first conductive strips and a plurality of second conductive strips, respectively. Each of these conductive strips can be made up by a plurality of conductive pads and connecting lines connected to the conductive pads in series.

In the process of mutual capacitive detection, one of the first conductive layer and the second conductive layer is driven, while the other of the first conductive layer and the second conductive layer is detected. For example, a driving signal is sequentially provided to each first conductive strip, and corresponding to each first conductive strip provided with the driving signal, signals from all of the second conductive strips are detected, which represent capacitive coupling signals at the intersections between the first conductive strip provided with the driving signal and all the second conductive strips. As a result, capacitive coupling signals at the intersections between all the first and second conductive strips are obtained to form an image of capacitive values.

Accordingly, the image of capacitive values at the time when there is no external touches is obtained as a reference. By comparing the difference between the reference image and the image of capacitive values later detected, the touch or approach of an external conductive object can be determined, and furthermore, the position touched or approached by the external conductive object can be determined. However, a lot of noise interferences are present in the surrounding environment, especially low frequency noise interferences, which might lead to misjudgments or errors in determined touch locations.

From the above it is clear that prior art still has shortcomings. In order to solve these problems, efforts have long been made in vain, while ordinary products and methods offering no appropriate structures and methods. Thus, there is a need in the industry for a novel technique that solves these problems.

SUMMARY OF THE INVENTION

When signal orthogonality is used as the basis for signal processing, square-wave drive will produce many odd harmonics. When a narrowband interference occurs near an odd harmonics, this interference cannot be eliminated. One objective of the present invention is to use sinusoidal drive, and establish a coefficient table for a plurality of predetermined phases, wherein each predetermined phase is designated with a coefficient. A sinusoidal wave is measured at the plurality of predetermined phases of each half cycle to produce measured signals, and each of the measured signals is multiplied with the coefficient corresponding to the phase at which the signal is measured to produce a weighted measured signal. Then, the weighted measured signals are summed to produce a complete measured signal, thereby suppressing the interferences of higher-order harmonics.

The above and other objectives of the present invention can be achieved by the following technical scheme. A method for measuring signals in accordance with the present invention may include: receiving a sinusoidal wave; measuring signals from the sinusoidal wave at a plurality of predetermined phases of at least a cycle of the sinusoidal wave; producing a weighted measured signal of the at least one cycle based on a product generated by multiplying each measured signal of the at least one cycle with the sine value of the predetermined phase at which the particular signal was measured; and summing all of the weighted measured signals of the at least one cycle to produce a complete measured signal.

The above and other objectives of the present invention can also be achieved by the following technical scheme. A device for measuring signals in accordance with the present invention may include: an analog measuring circuit for receiving a sinusoidal wave and measuring analog signals from the sinusoidal wave at a plurality of predetermined phases of at least a cycle of the sinusoidal wave; an analog-to-digital converter for converting each analog measured signal into a digital measured signal; and a processor for producing a digital weighted measured signal of the at least one cycle based on a product generated by multiplying each digital measured signal of the at least one cycle with the sine value of the predetermined phase at which the particular signal was measured, and summing all of the digital weighted measured signals of the at least one cycle to produce a complete measured signal.

The above and other objectives of the present invention can also be achieved by the following technical scheme. A device for measuring signals in accordance with the present invention may include: an analog measuring circuit for receiving a sinusoidal wave and measuring analog signals from the sinusoidal wave at a plurality of predetermined phases of at least a cycle of the sinusoidal wave; an amplifying circuit for amplifying each analog measured signal with a multiple of the sine value of the predetermined phase at which the particular signal was measured to produce an analog weighted measured signal; an analog-to-digital converter for converting each analog weighted measured signal into a digital weighted measured signal; and a processor for summing all of the digital weighted measured signals of the at least one cycle to produce a complete measured signal.

The above and other objectives of the present invention can also be achieved by the following technical scheme. A device for measuring signals in accordance with the present invention may include: an analog measuring circuit for receiving a sinusoidal wave and measuring analog signals from the sinusoidal wave at a plurality of predetermined phases of at least a cycle of the sinusoidal wave; an amplifying circuit for amplifying each analog measured signal with a multiple of the sine value of the predetermined phase at which the particular signal was measured to produce an analog weighted measured signal; an integrator circuit for performing integration on all of the analog measured signals of the at least one cycle to produce an analog complete measured signal; and an analog-to-digital converter for converting each analog complete measured signal into a digital complete measured signal.

With the above technical scheme, the present invention includes at least the following advantages and beneficial effects:

1. The interferences of higher-order harmonics are suppressed;
2. The processing requires no complicated circuits, but rather simple digital logical circuits; and
3. Integer coefficient values are used. Integer operations are simpler to implement than floating point operations.

The above description is only an outline of the technical schemes of the present invention. Preferred embodiments of the present invention are provided below in conjunction with the attached drawings to enable one with ordinary skill in the art to better understand said and other objectives, features and advantages of the present invention and to make the present invention accordingly.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Figure 1A:
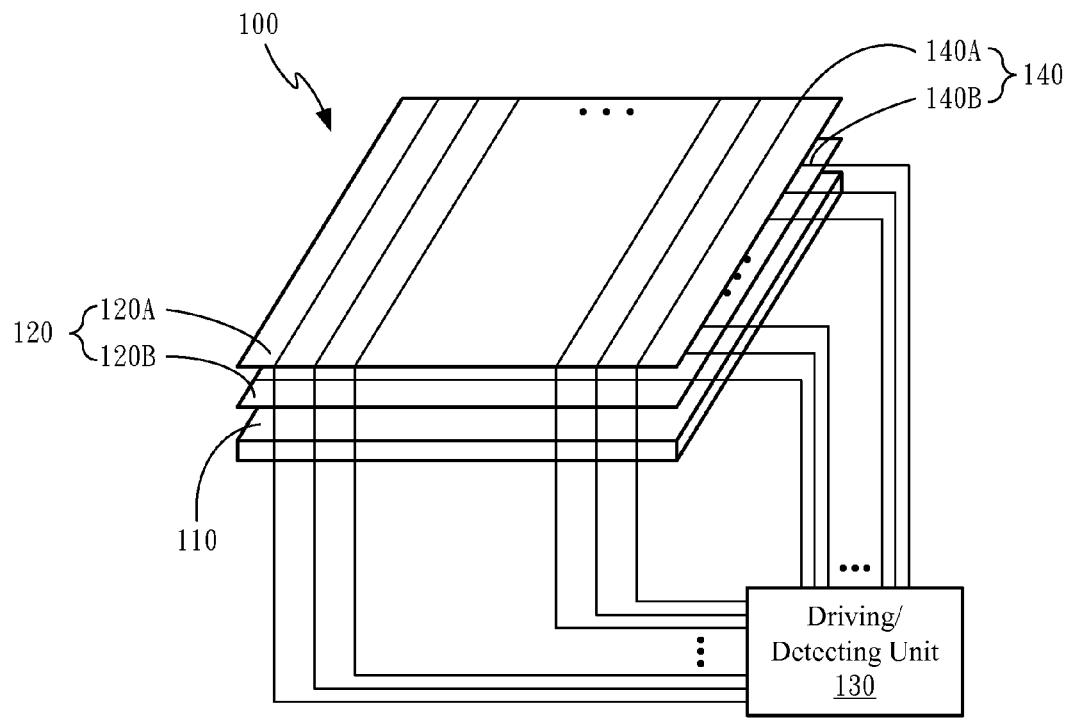
FIGS. 1A, 1B and 1C are schematic diagrams illustrating mutual capacitive detection.

Some embodiments of the present invention are described in details below. However, in addition to the descriptions given below, the present invention can be applicable to other embodiments, and the scope of the present invention is not limited by such, rather by the scope of the claims. Moreover, for better understanding and clarity of the description, some components in the drawings may not necessary be drawn to scale, in which some may be exaggerated relative to others, and irrelevant parts are omitted.

Referring to FIG. 1A, a position detecting device 100 applicable to the present invention is shown, which includes a sensing device 120 and a driving/detecting unit 130. The sensing device 120 has a sensing layer. In an example of the present invention, the sensing layer can include a first sensing layer 120A and a second sensing layer 120B. The first and second sensing layers 120A and 120B each has a plurality of conductive strips 140, wherein the first conductive strips 140A of the first sensing layer 120A and the second conductive strips 140B of the second sensing layer 120B cross each other. In another example of the present invention, the first and second conductive strips 140A and 140B are disposed on a co-planar sensing layer. The driving/detecting unit 130 produces sensing information based on signals of the conductive strips 140. In the case of self-capacitive detection, for example, conductive strips 140 that are being driven are detected. In the case of mutual-capacitive detection, some of the conductive strips 140 that are not being directly driven by the driving/detecting unit 130 are detected. In addition, the sensing device 120 can be disposed on a display 110. An optional rear shielding layer (not shown) can be interposed between the sensing device 120 and the display 110. In a preferred example of the present invention, there is no rear shielding layer between the sensing device 120 and the display 110 so as to reduce the thickness of the sensing device 120.

The first and second conductive strips can be a plurality of column conductive strips and row conductive strips arranged in columns and rows; a plurality of first dimensional conductive strips and second dimensional conductive strips arranged in first and second dimensions; or a plurality of first axial conductive strips and second axial conductive strips arranged in first and second axes. In addition, the first and second conductive strips can be arranged in orthogonal or non-orthogonal directions. For example, in a polar coordinate system, one of the first and second conductive strips can be arranged in radial direction, and the other one of the first and second conductive strips can be arranged in circular direction. Furthermore, one of the first and second conductive strips can be driving conductive strips, while the other one of the first and second conductive strips can be detecting conductive strips. Said "first dimension" and "second dimension", "first axis" and "second axis", "driving" and "detecting", "driven" or "detected" conductive strips can be used to mean said "first and "second" conductive strips, including but not limited to, being arranged in orthogonal grids, and in any other geometric configurations comprising first dimensional and second dimensional intersecting conductive strips.

Figure 1B:
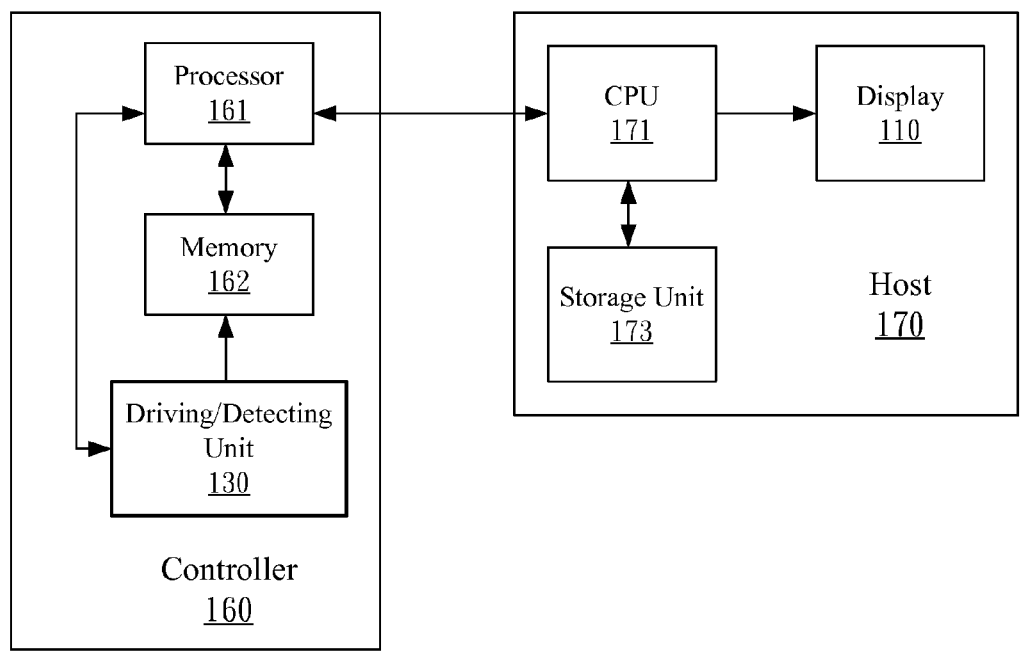

The position detecting device 100 of the present invention can be applied to a computing system as shown in FIG. 1B, which includes a controller 160 and a host 170. The controller includes the driving/detecting unit 130 to operatively couple the sensing device 120 (not shown). In addition, the controller 160 can include a processor 161 for controlling the driving/detecting unit 130 in generating the sensing information. The sensing information can be stored in a memory 162 and accessible by the processor 161. Moreover, the host 170 constitutes the main body of the computing system, and mainly includes a central processing unit 171, a storage unit 173 that can be accessed by the central processing unit 171, and the display 110 for displaying results of operations.

In another example of the present invention, there is a transmission interface between the controller 160 and the host 170. The controlling unit transmits data to the host via the transmission interface. One with ordinary skill in the art can appreciate that the transmission interface may include, but not limited to, UART, USB, I2C, Bluetooth, Wi-Fi, IR and other wireless or wired transmission interfaces. In an example of the present invention, data transmitted can be positions (e.g. coordinates), identified results (e.g. gesture codes), commands, sensing information or other information provided by the controller 160.

In an example of the present invention, the sensing information can be initial sensing information generated under the control of the processor 161, and this information is passed onto the host 170 for position analysis, such as position analysis, gesture determination, command identification, and so on. In another example of the present invention, the sensing information can be analyzed by processor 161 first before forwarding the determined positions, gestures, commands, or the like to the host 170. The present invention does not limit to this example, and one with ordinary skill in the art can readily recognize other interactions between the controller 160 and the host 170.

At each intersection of the conductive strips, the upper and lower conductive strips form the positive and negative electrodes. Each intersection can be regarded as one pixel in an image. When one or more external conductive objects approach or touch the sensing device, said image can be regarded as a photographed touch image (e.g. the pattern of a finger upon touching the sensing device).

When a driven conductive strip is being provided with a driving signal, the driven conductive strip itself produces self capacitance, and produces mutual capacitance on each intersection of the driven conductive strip. Said self-capacitive detection is detecting the self-capacitance of all the conductive strips, which is particularly useful in determining approach or touch of a single external conductive object.

In said mutual-capacitive detection, when a driven conductive strip is being provided with a driving signal, capacitances or changes in capacitances of all intersections on the driven conductive strip are detected with all sensed conductive strips arranged in different dimensions to the driven conductive strip, and are regarded as a row of pixels. Accordingly, all the rows of pixels are combined to form said image. When one or more external conductive objects approach or touch the sensing device, said image can be regarded as a photographed touch image, which is particularly useful in determining approaches or touches of a plurality of external conductive objects.

These conductive strips (the first and second conductive strips) can be made of transparent or opaque materials, such as transparent Indium Tin Oxide (ITO). In terms of the structure, it can be categorized into a Single ITO (SITO) structure and a Double ITO (DITO) structure. One with ordinary skill in the art can appreciate that other materials can be used as the conductive strips, such as carbon nanotube, and they will not be further described.

In an example of the present invention, the horizontal direction is regarded as the first direction, while the vertical direction is regarded as the second direction. Thus, the horizontal conductive strips are the first conductive strips, and the vertical conductive strips are the second conductive strips. However, one with ordinary skill in the art can appreciate that the above is merely an example of the present invention, and the present invention is not limited to this. For example, the vertical direction can be regarded as the first direction, while the horizontal direction can be regarded as the second direction.

During 2D mutual capacitive detection, alternating driving signals are sequentially provided to each first conductive strip, and 1D sensing information corresponding to each driven first conductive strip is obtained from the signals of the second conductive strips. Sensing information of all the first conductive strips are combined together to form 2D sensing information. 1D sensing information can be generated based on the signal of a second conductive strip, or based on the difference between the signal of a conductive strip and a reference value. In addition, the sensing information can be generated based on current, voltage, level of capacitive coupling, amount of charge or other electrical characteristics, and can be in analog or digital form.

When there is no external object actually approaching or covering the touch screen, or when the system has not determined any external object actually approaching or covering the touch screen, the position detecting device may generated a reference value based on the signals of the second conductive strips. This reference value represents stray capacitance on the touch screen. Sensing information can be generated based on the signal of a second conductive strip or the result of subtracting the reference value from the signal of the second conductive strip.

Figure 1C:
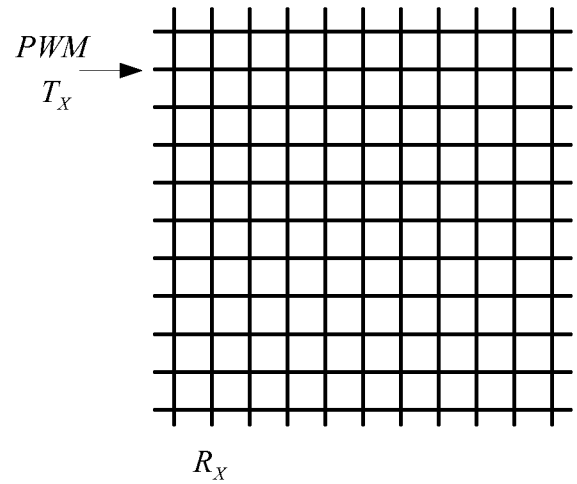

Referring to FIG. 1C, a schematic diagram illustrating the aforementioned 2D mutual capacitive detection is shown. A first conductive strip $T_x$ sends out a pulse width modulation (PWM) signal. Through capacitive coupling between the first conductive strip $T_x$ and the second conductive strip $R_x$, a signal having the same frequency and a certain phase difference with the signal from $T_x$ is received by the second conductive strip $R_x$.

The present invention proposes a method and device for measuring signals which employs signal orthogonality as the basis for signal processing.

For example, the signal received at Rx is $S(t)=A \sin(\omega t)$, wherein A is the amplitude.

$\int_0^T \sin(m\omega t)\sin(n\omega t)dt =_{A, m=n}^{0, m \neq n}$, only when $m=n$, there are integral values.

However, signal multiplication circuit is usually difficult to implement in practice, so traditional methods have employed square waves for implementation, thus it becomes:

$I=\int (PWM)sgn(PWM)dt.$

The Fourier series of the square wave itself can be spread out and represented as follows:

$$\sqcap\sqcup\sqcap = \sum_{n=0}^{\infty} \sin(n\omega t) \cdot C_n,$$

which is comprised of many odd harmonics. Thus, it can be rewritten as:

$I=\int_0^T S(t)[\sin(\omega t)+\frac{1}{3}\sin(3\omega t)+ \ldots ]dt,$ wherein S(t)=square wave or sine wave+n(t), wherein n(t) is the noise or interference.

$\rightarrow I=\int [\sin(\omega t)+n(t)][\sin(\omega t)+\frac{1}{3}\sin(3\omega t)+ \ldots ]dt,$ wherein the existence of odd harmonics components can be observed.

Figure 2:
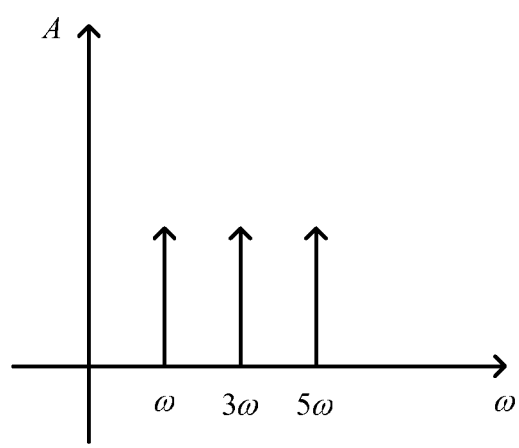
FIG. 2 is a schematic diagram illustrating measured signals influenced by higher-order harmonics.

Thus, when a narrowband interference occurs in the vicinity of an odd harmonics, the effect of this interference cannot be eliminated, as shown in FIG. 2. Especially when an analog-to-digital converter (ADC) is used to sample data of the same phase at each half cycle, then add them together and calculate Σ (positive half cycle−negative half cycle), the influence of higher-order odd harmonics is more prominent.

Thus, in a best mode of the present invention, sinusoidal drive is employed, and a coefficient table is established for a plurality of predetermined phases, wherein each predetermined phase is designated with a corresponding coefficient. In a preferred example of the present invention, the coefficient is a multiple of the sine value of the corresponding predetermined phase, as shown by the table below.

TABLE 1

| Phase | Coefficient |
|---|---|
| 30° | 1 |
| 90° | 2 |
| 150° | 1 |
| 210° | −1 |
| 270° | −2 |
| 330° | −1 |

Figure 3:
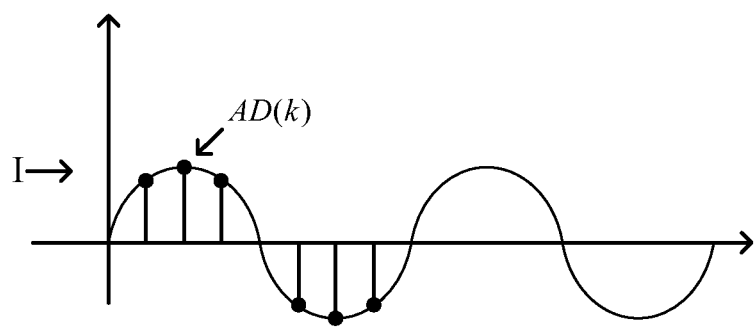
FIG. 3 is a schematic diagram illustrating measuring of a sinusoidal wave at several predetermined phases of each half cycle to produce measured signals.

Moreover, the sinusoidal wave is measured at the plurality of predetermined phases in each half cycle to generate measured signals, as shown in FIG. 3, wherein the wave is measured for at least a half cycle. Then, each measured signal is multiplied with the coefficient corresponding to the phase at which the signal is measured to produce a weighted measured signal. The weighted signals are summed to produce a complete measured signal.

The present invention may also employ PWM signals. Although in Table 1 and FIG. 3, six measured signals are taken in one full cycle, and each measurement differs a phase of 60 degrees, these are only given for the purpose of illustration, and the present invention is not limited as such. One with ordinary skill in the art can appreciate that two, four or more measured signals can be taken in each full cycle, and the phase differences between the measured signals may not the same or different; the present invention is not limited as such.

According to the above, a complete measured signal can be $$I = \sum_{k=0}^{nT} AD(k) \cdot C(k).$$

Referring to the previous equation $\int_0^T \sin(m\omega t)\sin(n\omega t) dt = _{A,\ m=n}^{0,\ m\neq n}$, AD(k) corresponds to sin(mωt), and C(k) corresponds to sin(nωt), wherein m=n.

Figure 4:
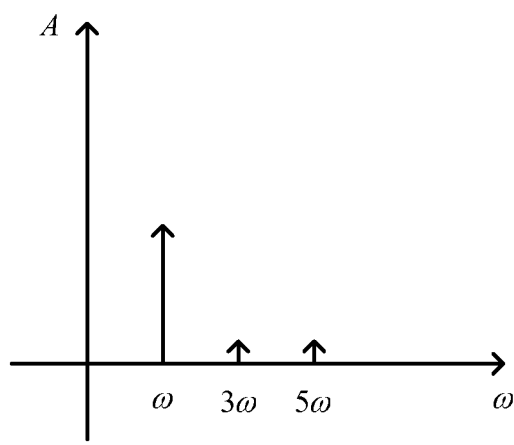
FIG. 4 is a schematic diagram illustrating measured signals after suppressing the influences of the higher-order harmonics.

In Table 1, the coefficient is double the sine value of the corresponding phase. This is because after doubling, the results are integers. Integer operations are simpler than floating point operations. Accordingly, in an example of the present invention, C(k) is made to be an integer, that is, multiplied by a ratio so that it becomes an integer. As a result, the interference of higher-order harmonics can be suppressed as shown in FIG. 4.

The summing of each weighted measured signals can be implemented by digital logic circuits. For example, after measuring an analog signal (e.g. AD(k)), the analog measured signal is converted into a digital measured signal, and then summing of each weighted measured signal is carried out. In other words, this method requires no complex circuits, but rather simple digital logic circuits.

Figure 5:
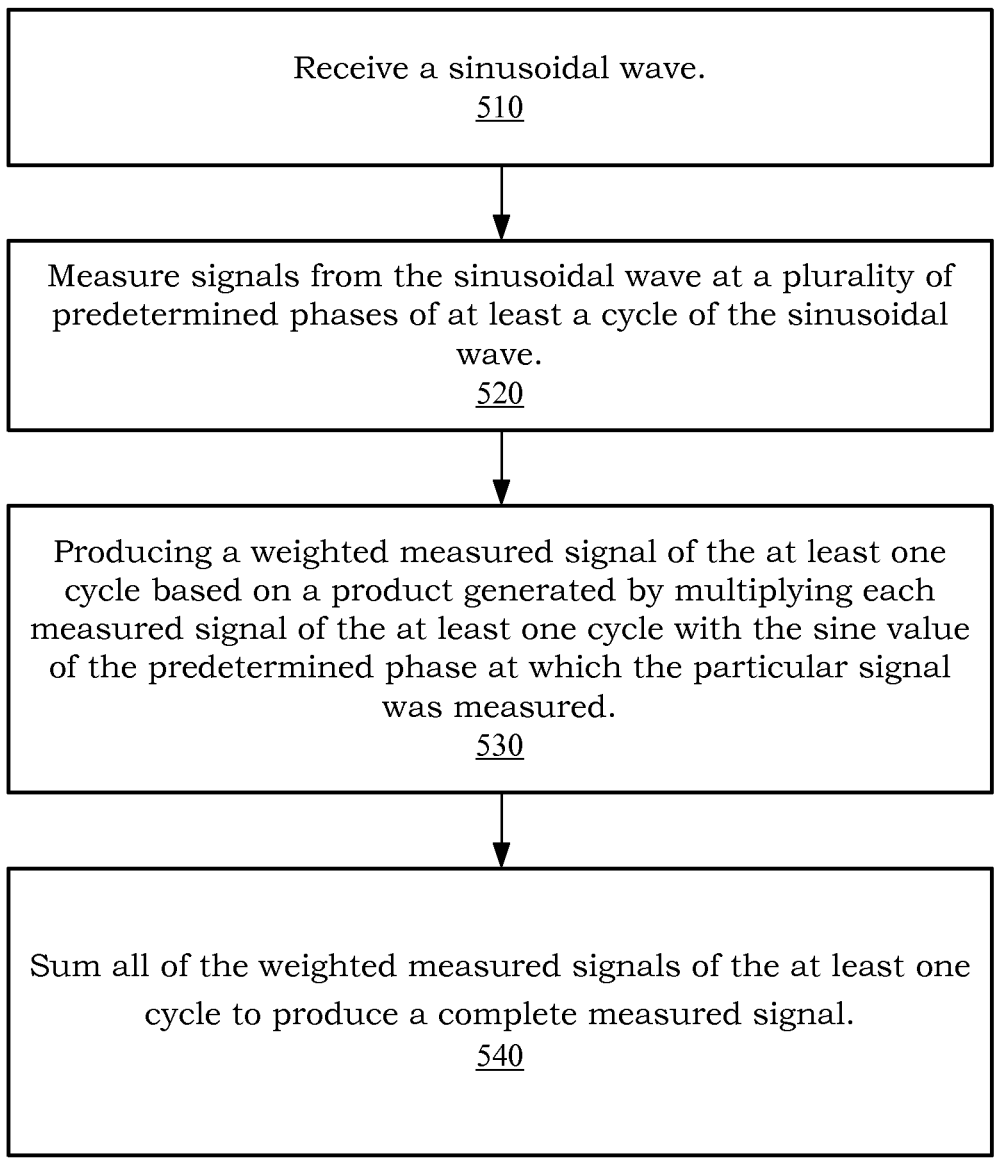
FIG. 5 is a flowchart illustrating a method for measuring signals in accordance with a first embodiment of the present invention.

According to the above, a method for measuring signals is provided in a first embodiment of the present invention, as shown in FIG. 5. First, in step 510, a sinusoidal wave is received. The sinusoidal wave can be provided by the aforementioned controller at one or a set of driving conductive strips of a touch sensor. In addition, the sinusoidal wave is received by one of a plurality of sensing conductive strips in the touch sensor intersecting with the one or the set of driving conductive strips provided with the sinusoidal wave. The one of the plurality of sensing conductive strips receives the sinusoidal wave through capacitive coupling with the one or the set of driving conductive strips provided with the sinusoidal wave. Then, in step 520, signals are measured from the sinusoidal wave at a plurality of predetermined phases of at least a cycle of the sinusoidal wave, wherein the measured signals can be in an analog or a digital form. Next, in step 530, a weighted measured signal of the at least one cycle is produced based on a product generated by multiplying each measured signal of the at least one cycle with the sine value of the predetermined phase at which the particular signal was measured, wherein the weighted measured signal can be in an analog or a digital form. Thereafter, in step 540, all the weighted measured signals of the at least one cycle are summed to produce a complete measured signal, wherein the complete measured signal can be in an analog or a digital form.

In an example of the present invention, each measured signal is converted from an analog measured signal to a digital measured signal, wherein the signals measured from the sinusoidal wave are in the analog form, and each weighted measured signal is a digital product of a digital measured signal multiplied by a digital sine value. Similarly, the summing of all the weighted measured signals of the at least one cycle to produce a complete measured signal is performed in a digital manner. Moreover, the weighted measured signals are digital products of digital measured signals multiplied by respective integers, wherein each integer is obtained by multiplying the sine value with the same multiple.

In another example of the present invention, each weighted measured signal is converted from an analog weighted measured signal to a weighted digital measured signal, wherein the measured signals are in the analog form, and each weighted measured signal is obtained by amplifying the analog measured signal with a multiple of the sine value of the predetermined phase at which the signal was measured. In addition, the summing of the weighted measured signals can be performed in an analog or a digital manner. For example, the summing of all the weighted measured signals of the at least one cycle is carried out by integration, for example, by an integrator circuit, and wherein the measured signals and the weighted measured signals are in analog forms. As another example, all of the weighted measured signals are first converted from an analog form to a digital form to produce analog weighted measured signals before summing them.

In an example of the present invention, the predetermined phases are continuously arranged. Adjacent phases have the same phase difference, such as 60 degrees.

Figure 6:
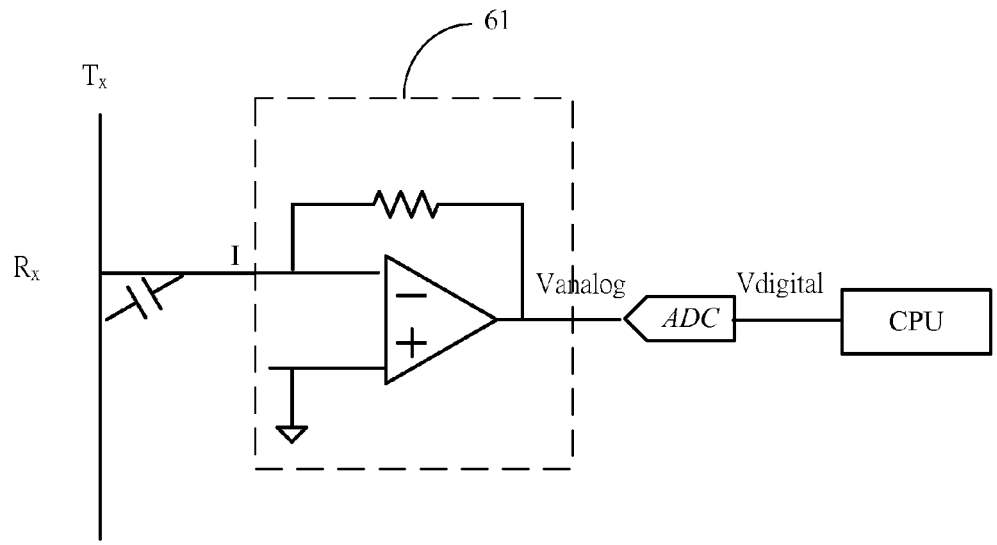
FIG. 6 is a circuit diagram illustrating a method for measuring signals in accordance with a second embodiment of the present invention.

FIG. 6 is a schematic diagram depicting a device for measuring signals proposed by a second embodiment of the present invention. The device includes: an analog measuring circuit 61, an analog-to-digital circuit (ADC), and a processor (e.g. a CPU). The analog measuring circuit 61 receives and measures a sinusoidal wave at a plurality of predetermined phases of at least one cycle of the sinusoidal wave to produce analog measured signals. In an example of the present invention, the sinusoidal wave can be represented by current, and the analog measuring circuit 61 can be a current-to-voltage circuit, wherein the current I of the sinusoidal wave is converted into analog measured signals Vanalog based on a reference resistor R. Moreover, the ADC converts each analog measured signal Vanalog into a digital measured signal Vdigital. In addition, the processor generates a digital weighted measured signal of the at least one cycle based on a product generated by multiplying each digital measured signal Vdigital of the at least one cycle with the sine value of the predetermined phase at which the particular signal was measured, and then sums all the digital weighted measured signals of the at least one cycle to produce a complete measured signal. In an example of the present invention, the digital weighted measured signals are digital products of digital measured signals Vdigital multiplied by respective integers, wherein each integer is obtained by multiplying the respective sine value with the same multiple.

Figure 7:
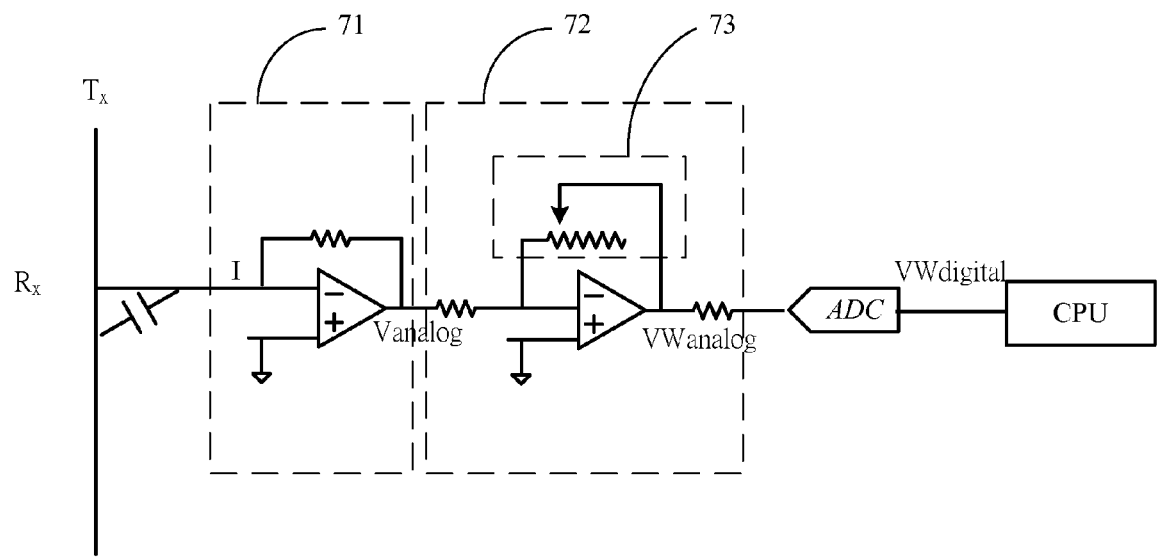
FIG. 7 is a circuit diagram illustrating a method for measuring signals in accordance with a third embodiment of the present invention.

FIG. 7 is a schematic diagram depicting a device for measuring signals proposed by a third embodiment of the present invention. The device includes: an analog measuring circuit 71, an amplifying circuit 72, an ADC, and a processor (e.g. a CPU). The analog measuring circuit 71 receives and measures a sinusoidal wave at a plurality of predetermined phases of at least one cycle of the sinusoidal wave to produce analog measured signals Vanalog. The amplifying circuit 72 then amplifies each analog measured signal Vanalog by a multiple of the sine value of the predetermined phase at which the particular signal was measured to produce an analog weighted measured signal VWanalog. In an example of the present invention, a set of variable resistors 73 can be used to determine the multiple. The ADC then converts each analog weighted measured signal VWanalog into a digital weighted measured signal VWdigital. Next, the processor sums all of the digital weighted measured signals VWdigital of the at least one cycle to produce a complete measured signal.

Figure 8:
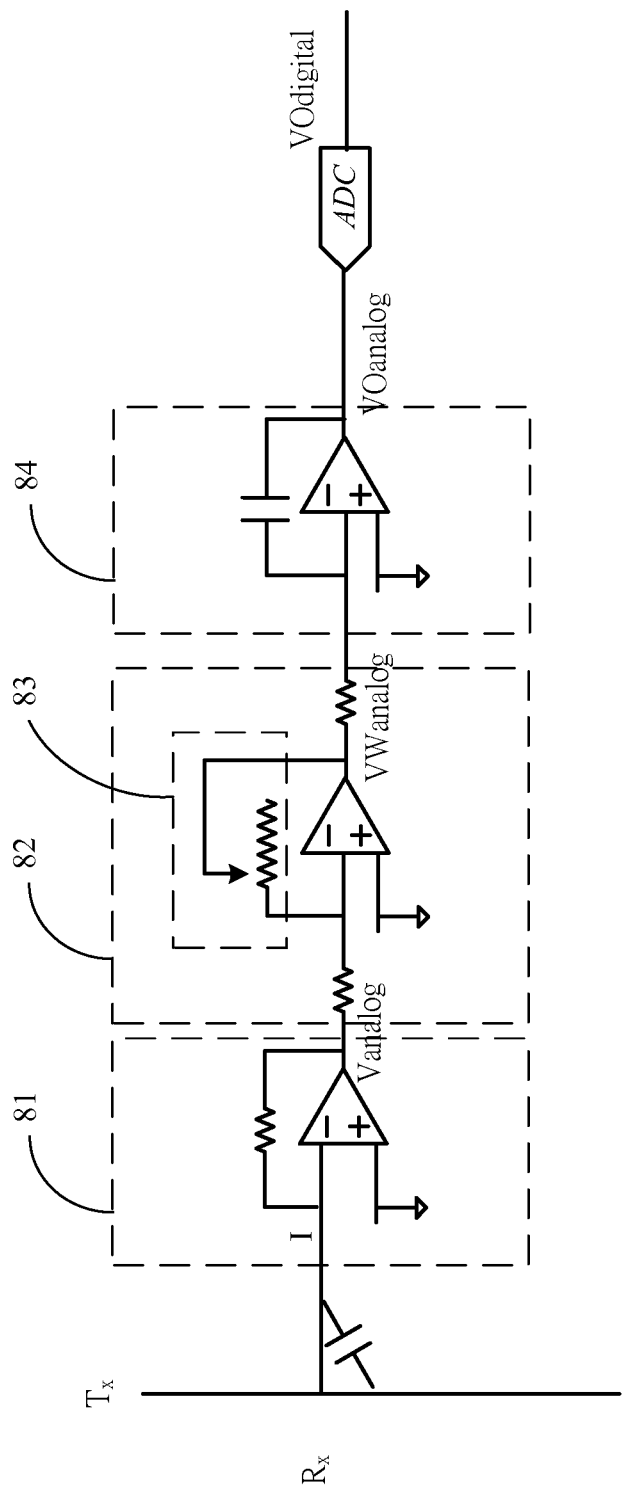
FIG. 8 is a circuit diagram illustrating a method for measuring signals in accordance with a fourth embodiment of the present invention.

FIG. 8 is a schematic diagram depicting a device for measuring signals proposed by a fourth embodiment of the present invention. The device includes: an analog measuring circuit 81, an amplifying circuit 82, an integrator circuit 84, and an ADC. The analog measuring circuit 81 receives and measures a sinusoidal wave at a plurality of predetermined phases of at least one cycle of the sinusoidal wave to produce analog measured signals Vanalog. The amplifying circuit 82 then amplifies each analog measured signal Vanalog by a multiple of the sine value of the predetermined phase at which the particular signal was measured to produce an analog weighted measured signal VWanalog. In an example of the present invention, a set of variable resistors 83 can be used to determine the multiple. The integrator circuit 84 performs integration on all of the analog weighted measured signals VWanalog of the at least one cycle to produce an analog complete measured signal VOanalog. Thereafter, the ADC converts each analog complete measured signal VOanalog into a digital complete measured signal VOdigital.

The above analog measuring circuit can be implemented by an integrator circuit or a sample-and-hold circuit, or any other circuit that is capable of receiving a sinusoidal wave; the present invention is not limited as such.

The above embodiments are only used to illustrate the principles of the present invention, and they should not be construed as to limit the present invention in any way. The above embodiments can be modified by those with ordinary skill in the art without departing from the scope of the present invention as defined in the following appended claims.

What is claimed is:

1. A method for measuring signals in a touch sensor, comprising:
   receiving a sinusoidal wave by a sensing conductive strip in the touch sensor, wherein the sinusoidal wave is provided by a driving conductive strip intersecting the sensing conductive strip;
   measuring signals from the sinusoidal wave at a plurality of predetermined phases of at least a cycle of the sinusoidal wave, wherein the plurality of phases are separated 60 degrees;
   producing a weighted measured signal of the at least one cycle based on a product generated by multiplying each measured signal of the at least one cycle with an integer coefficient which is a multiple of the sine value of the predetermined phase at which the particular signal was measured; and
   summing all of the weighted measured signals of the at least one cycle to produce a complete measured signal.

2. The method of claim 1, further comprising:
   providing the sinusoidal wave at one or a set of driving conductive strips of a touch sensor; and
   receiving the sinusoidal wave by one of a plurality of sensing conductive strips in the touch sensor intersecting with the one or the set of driving conductive strips provided with the sinusoidal wave, the one of the plurality of sensing conductive strips receiving the sinusoidal wave through capacitive coupling with the one or the set of driving conductive strips provided with the sinusoidal wave.

3. The method of claim 1, further comprising:
   converting each measured signal from an analog measured signal to a digital measured signal, wherein the signals measured from the sinusoidal wave are in an analog form, and each weighted measured signal is a digital product of a digital measured signal multiplied by a digital sine value.

4. The method of claim 1, wherein the weighted measured signals are digital products of digital measured signals multiplied by respective integers, wherein the integers are obtained by multiplying the respective sine value with the same multiple.

5. The method of claim 1, further comprising:
   converting each weighted measured signal from an analog weighted measured signal to a digital weighted measured signal, wherein the measured signals are in an analog form, and each analog weighted measured signal is obtained by amplifying the analog measured signal with a multiple of the sine value of the predetermined phase at which the signal was measured.

6. The method of claim 1, wherein the summing of all the weighted measured signals of the at least one cycle is carried out by integration, and the measured signals and the weighted measured signals are in the analog form.

7. The method of claim 1, wherein the predetermined phases are continuously arranged, and wherein adjacent phases have the same phase difference.

8. The method of claim 1, wherein the phases are at 30, 90, 150, 210, 270, and 330 degrees.

9. A device for measuring signals in a touch sensor, comprising:
   an analog measuring circuit for receiving a sinusoidal wave by a sensing conductive strip in the touch sensor, wherein the sinusoidal wave is provided by a driving conductive strip intersecting the sensing conductive strip, and the analog measuring circuit is further for measuring analog signals from the sinusoidal wave at a plurality of predetermined phases of at least a cycle of the sinusoidal wave, wherein the plurality of phases are separated 60 degrees;
   an analog-to-digital converter for converting each analog measured signal into a digital measured signal; and
   a processor for producing a digital weighted measured signal of the at least one cycle based on a product generated by multiplying each digital measured signal of the at least one cycle with an integer coefficient which is a multiple of the sine value of the predetermined phase at which the particular signal was measured, and summing all of the digital weighted measured signals of the at least one cycle to produce a complete measured signal.

10. The device of claim 9, wherein the digital weighted measured signals are digital products of the digital measured signals multiplied by respective integers, wherein the integers are obtained by multiplying the respective sine value with the same multiple.

11. The device of claim 9, wherein the predetermined phases are continuously arranged, and wherein adjacent phases have the same phase difference.

12. The device of claim 9, wherein the phases are at 30, 90, 150, 210, 270, and 330 degrees.

13. A device for measuring signals in a touch sensor, comprising:
   an analog measuring circuit for receiving a sinusoidal wave by a sensing conductive strip in the touch sensor, wherein the sinusoidal wave is provided by a driving conductive strip intersecting the sensing conductive strip, and the analog measuring circuit is further for measuring analog signals from the sinusoidal wave at a plurality of predetermined phases of at least a cycle of the sinusoidal wave, wherein the plurality of phases are separated 60 degrees;
   an amplifying circuit for amplifying each analog measured signal with an integer coefficient which is a multiple of the sine value of the predetermined phase at which the particular signal was measured to produce an analog weighted measured signal;
   an analog-to-digital converter for converting each analog weighted measured signal into a digital weighted measured signal; and
   a processor for summing all of the digital weighted measured signals of the at least one cycle to produce a complete measured signal.

14. The device of claim 13, wherein the predetermined phases are continuously arranged, and wherein adjacent phases have the same phase difference.

15. The device of claim 13, wherein the phases are at 30, 90, 150, 210, 270, and 330 degrees.

16. A device for measuring signals in a touch sensor, comprising:
   an analog measuring circuit for receiving a sinusoidal wave by a sensing conductive strip in the touch sensor, wherein the sinusoidal wave is provided by a driving conductive strip intersecting the sensing conductive strip, and the analog measuring circuit is further for measuring analog signals from the sinusoidal wave at a plurality of predetermined phases of at least a cycle of the sinusoidal wave, wherein the plurality of phases are separated 60 degrees;
   an amplifying circuit for amplifying each analog measured signal with an integer coefficient which is a multiple of the sine value of the predetermined phase at which the particular signal was measured to produce an analog weighted measured signal;
   an integrator circuit for performing integration on all of the analog measured signals of the at least one cycle to produce an analog complete measured signal; and an analog-to-digital converter for converting each analog complete measured signal into a digital complete measured signal.

17. The device of claim 16, wherein the predetermined phases are continuously arranged, and wherein adjacent phases have the same phase difference.

18. The device of claim 16, wherein the phases are at 60, 90, 150, 210, 270, and 330 degrees.

* * * * *